United States Patent
Xie et al.

(10) Patent No.: US 12,061,021 B2
(45) Date of Patent: Aug. 13, 2024

(54) SOLVENT CAST ELECTROCALORIC POLYMER FILMS

(71) Applicant: United Technologies Corporation, Farmington, CT (US)

(72) Inventors: Wei Xie, East Hartford, CT (US); Subramanyaravi Annapragada, Shrewsbury, MA (US); Joseph V. Mantese, Ellington, CT (US); Parmesh Verma, South Windsor, CT (US); Thomas D. Radcliff, Vernon, CT (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 301 days.

(21) Appl. No.: 16/064,784

(22) PCT Filed: Dec. 21, 2015

(86) PCT No.: PCT/US2015/067192
§ 371 (c)(1),
(2) Date: Jun. 21, 2018

(87) PCT Pub. No.: WO2017/111922
PCT Pub. Date: Jun. 29, 2017

(65) Prior Publication Data
US 2019/0003746 A1    Jan. 3, 2019

(51) Int. Cl.
*B29C 41/00*    (2006.01)
*B29C 41/12*    (2006.01)
(Continued)

(52) U.S. Cl.
CPC ............ *F25B 21/00* (2013.01); *B29C 41/003* (2013.01); *B29C 41/12* (2013.01); *H10N 15/15* (2023.02);
(Continued)

(58) Field of Classification Search
CPC ............................. F25B 21/00; B29C 41/003
See application file for complete search history.

(56) References Cited

U.S. PATENT DOCUMENTS

| | | | | |
|---|---|---|---|---|
| 8,869,542 | B2 * | 10/2014 | Zhang | .................... F25B 21/00 |
| | | | | 165/104.23 |
| 2009/0317683 | A1 * | 12/2009 | Kawahara | .............. C08G 61/12 |
| | | | | 429/483 |

(Continued)

FOREIGN PATENT DOCUMENTS

| CN | 104877151 B | 9/2015 |
|---|---|---|
| WO | 2015156794 A1 | 10/2015 |
| WO | 2015167529 A1 | 11/2015 |

OTHER PUBLICATIONS

Shklovsky et al. ("Nano-imprinting lithography of P(VDF-TrFE-CFE) for flexible freestanding MEMS devices", Microelectronic Engineering, vol. 100, Dec. 2012, p. 41-46).*

Engel et al. ("Thermoplastic nanoimprint lithography of electroactive polymer poly(vinylidene fluoridetrifluoroethylenechlorofluoroethylene) for micro/nanoscale sensors and actuators", Journal of Micro/Nanolithography, MEMS, and MOEMS, vol. 13(3), p. 033011-1 to 033011-6, Jun.-Sep. 2014).*

(Continued)

*Primary Examiner* — Thomas T Pham
(74) *Attorney, Agent, or Firm* — CANTOR COLBURN LLP

(57) ABSTRACT

A method of making an electrocaloric element includes dissolving or dispersing an electrocaloric polymer in an organic solvent having a boiling point of less than 100° C. at 1 atmosphere to form a liquid composition comprising the electrocaloric polymer. A film of the liquid composition is cast on a substrate, and the organic solvent is evaporated to form a film of the electrocaloric polymer. The film is removed from the substrate and disposed between electrical conductors to form an electrocaloric element.

15 Claims, 2 Drawing Sheets

(51) Int. Cl.
*F25B 21/00* (2006.01)
*H10N 15/10* (2023.01)
*B29L 7/00* (2006.01)

(52) U.S. Cl.
CPC . *B29K 2995/0003* (2013.01); *B29L 2007/008* (2013.01); *F25B 2321/001* (2013.01); *Y02B 30/00* (2013.01)

(56) References Cited

U.S. PATENT DOCUMENTS

| | | | | |
|---|---|---|---|---|
| 2011/0110015 A1* | 5/2011 | Zhang | ............... | H01G 4/33 361/311 |
| 2011/0113791 A1 | 5/2011 | Kruglick | | |
| 2014/0103554 A1* | 4/2014 | Koslow | ............... | C08L 101/12 524/173 |
| 2014/0134418 A1* | 5/2014 | Lee | ............... | H01L 41/37 428/221 |
| 2014/0230453 A1* | 8/2014 | Kruglick | ............... | F25B 21/00 62/3.1 |
| 2016/0168346 A1* | 6/2016 | Kamada | ............... | H01G 9/02 429/492 |
| 2017/0030611 A1* | 2/2017 | Radcliff | ............... | F25B 21/00 |
| 2017/0157572 A1* | 6/2017 | Iwai | ............... | D01D 5/24 |
| 2018/0238594 A1* | 8/2018 | Mantese | ............... | F25B 21/00 |

OTHER PUBLICATIONS

Chen et al., "Low-temperature crystallization of P(VDF-TrFE-CFE) studied by FlashDSC", Jan. 2016.*
Pramanik, "Origin of dielectric relaxor behavior in PVDF-based copolymer and terpolymer films", AIP Advances, Apr. 4, 2018.*
Wang et al., "New Properties and Applications of Polyvinylidene-Based Ferroelectric Polymer", Jul. 29, 2015.*
Anonymous, "PVDF Active Solvents and PVDF Latent Solvents", Piezotech, Dec. 18, 2014, p. 1-2.
D. Guo, et al.,"Electrocaloric characterization of a poly(vinylidene fluoridetrifluoroethylene-chlorofluoroethylene) terpolymer by infra-red imaging", Applied Physics Letters, Jul. 21, 2014, p. 1-4.
Guo Dongzhi et al. Design and modeling of a fluid-based micro-scale electrocaloric refrigeration system, vol. 72, pp. 559-564, International Journal of Heat and Mass Transfer, 2014.
International Preliminary Report on Patentability; International Application No. PCT/US2015/067193; mailed Jul. 5, 2018; 10 pages.
International Search Report; International Application No. PCT/US2015/067192; dated Sep. 20, 2016; 6 pages.
Written Opinion of the International Searching Authority; International Application No. PCT/US2015/067192; Sep. 20, 2016; 10 pages.

* cited by examiner

SOLVENT CAST ELECTROCALORIC POLYMER FILMS

CROSS REFERENCE TO RELATED APPLICATIONS

This is a National Stage application of PCT/US2015/067192, filed Dec. 21, 2015, which is incorporated herein by reference in its entirety.

BACKGROUND

A wide variety of technologies exist for cooling applications, including but not limited to evaporative cooling, convective cooling, or solid state cooling such as electrothermic cooling. One of the most prevalent technologies in use for residential and commercial refrigeration and air conditioning is the vapor compression refrigerant heat transfer loop. These loops typically circulate a refrigerant having appropriate thermodynamic properties through a loop that comprises a compressor, a heat rejection heat exchanger (i.e., heat exchanger condenser), an expansion device and a heat absorption heat exchanger (i.e., heat exchanger evaporator). Vapor compression refrigerant loops effectively provide cooling and refrigeration in a variety of settings, and in some situations can be run in reverse as a heat pump. However, many of the refrigerants can present environmental hazards such as ozone depleting potential (ODP) or global warming potential (GWP), or can be toxic or flammable. Additionally, vapor compression refrigerant loops can be impractical or disadvantageous in environments lacking a ready source of power sufficient to drive the mechanical compressor in the refrigerant loop. For example, in an electric vehicle, the power demand of an air conditioning compressor can result in a significantly shortened vehicle battery life or driving range. Similarly, the weight and power requirements of the compressor can be problematic in various portable cooling applications.

Accordingly, there has been interest in developing cooling technologies as alternatives to vapor compression refrigerant loops. Various technologies have been proposed such as field-active heat or electric current-responsive heat transfer systems relying on materials such as electrocaloric materials, magnetocaloric materials, or thermoelectric materials. However, many proposals have been configured as bench-scale demonstrations with limited capabilities for scalability or mass production.

Electrocaloric polymers such as polyvinylidene fluoride (PVDF) have been proposed for use in heat transfer systems. However, they are subject to a number of potential problems when fabricated in very thin film systems in an effort to achieve performance parameters, such as temperature lift comparable to conventional vapor compression heat transfer systems. Conventional polymer film fabrication techniques such as thermoplastic film extrusion often do not produce a polymer crystal structure that is optimal for electrocaloric performance Solvent casting is available as an alternate film fabrication technique. However, solvent casting can produce porous films that can lead to electrical arcing when exposed to an electric field to induce an electrocaloric effect in the film, which in turn can lead to premature film breakdown.

BRIEF DESCRIPTION

In some embodiments of the disclosure, a method of making a heat transfer system comprises dissolving or dispersing an electrocaloric polymer in an organic solvent having a boiling point of less than 100° C. at 1 atmosphere to form a liquid composition comprising the electrocaloric polymer. A film of the liquid composition is cast on a substrate, and the organic solvent is evaporated to form a film comprising the electrocaloric polymer. The film is removed from the substrate and disposed between electrical conductors to form an electrocaloric element. A fluid flow path is provided between the electrocaloric element and a heat source or a heat sink for controlled heat transfer between the electrocaloric element and the heat source or heat sink.

In some embodiments, a method of making an electrocaloric element comprises dissolving or dispersing an electrocaloric polymer in an organic solvent having a boiling point of less than 100° C. at 1 atmosphere to form a liquid composition comprising the electrocaloric polymer. A film of the liquid composition is cast on a substrate, and the organic solvent is evaporated to form a film comprising the electrocaloric polymer. The film is removed from the substrate and disposed between electrical conductors to form an electrocaloric element.

In any of the above embodiments, the solvent has a boiling point of less than 80° C. at 1 atmosphere.

In any of the above embodiments, the solvent has a boiling point of less than 70° C. at 1 atmosphere.

In any of the above embodiments, the solvent has a boiling point of at least 50° C. at 1 atmosphere.

In any of the above embodiments, the liquid composition comprises from 0.1 wt. % to 50 wt. % of the electrocaloric polymer, based on the total weight of the liquid composition.

In any of the above embodiments, the electrocaloric polymer is polyvinylidene fluoride or a liquid crystal polymer.

In any of the above embodiments, the organic solvent is evaporated at a temperature of 0° C. to 100° C. at <=10 atm but more specifically <=3 atm but more specifically <=1 atm.

In any of the above embodiments, the film is annealed for 1 minute to 1000 hours following evaporation of the organic solvent.

In any of the above embodiments, the film is annealed at a temperature of 0° C. to 200° C. following evaporation of the organic solvent.

In any of the above embodiments, the film has a breakdown strength of at least 10 V/μm.

In any of the above embodiments, the film has a breakdown strength of at least 50 V/μm.

In any of the above embodiments, the film has a breakdown strength of at least 100 V/μm.

In any of the above embodiments, the film has an electrocaloric adiabatic temperature lift of at least 0.1° C. when measured at 20 V/μm and an external temperature of 25° C.

In any of the above embodiments, the film has an electrocaloric adiabatic temperature lift of at least 5° C. when measured at 20 V/μm and an external temperature of 25° C.

In any of the above embodiments, the film has a electrocaloric adiabatic temperature lift of at least 10° C. when measured at 20 V/um and an external temperature of 25° C.

In any of the above embodiments, the film has a resistivity of at least $10^{10}$ Ω·cm.

In any of the above embodiments, the film has a dielectric loss tangent of less than or equal to 0.5.

In any of the above embodiments, the film has a dielectric loss tangent of at least 0.001.

In some embodiments, an electrocaloric element is formed by a method according to any of the above embodiments.

In some embodiments, a heat transfer system comprises an electrocaloric element formed by the method of any of the above embodiments, a first thermal flow path between the electrocaloric element and a heat sink, a second thermal flow path between the electrocaloric element and a heat source, and a controller configured to control electrical current to the conductive layers and to selectively direct transfer of heat energy from the electrocaloric element to the heat sink along the first thermal flow path or from the heat source to the electrocaloric element along the second thermal flow path.

BRIEF DESCRIPTION OF THE DRAWINGS

Subject matter of this disclosure is particularly pointed out and distinctly claimed in the claims at the conclusion of the specification. The foregoing and other features, and advantages of the present disclosure are apparent from the following detailed description taken in conjunction with the accompanying drawings in which:

DETAILED DESCRIPTION

Figure 1:
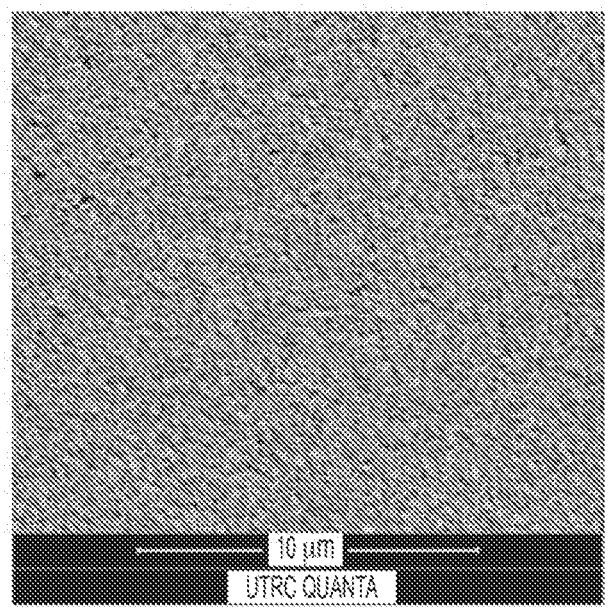
FIG. 1 is a photomicrograph of an electrocaloric polymer film prepared prepared according to the disclosure.

As mentioned above, a method of making an electrocaloric element comprises dissolving or dispersing an electrocaloric polymer in an organic solvent having a boiling point of less than 100° C. As used herein, unless otherwise explicitly stated boiling point means boiling point at 1 atmosphere pressure. The electrocaloric polymer can be any type of polymer that exhibits an electrocaloric effect when subjected to an electric field. Examples of electrocaloric polymers include, but are not limited to ferroelectric polymers, liquid crystal polymers, and liquid crystal elastomers.

Ferroelectric polymers are crystalline polymers, or polymers with a high degree of crystallinity, where the crystalline alignment of polymer chains into lamellae and/or sphenilite structures can be modified by application of an electric field. Such characteristics can be provided by polar structures integrated into the polymer backbone or appended to the polymer backbone with a fixed orientation to the backbone. Examples of ferroelectric polymers include polyvinylidene fluoride (PVDF), polytriethylene fluoride, odd-numbered nylon, copolymers containing repeat units derived from vinylidene fluoride, and copolymers containing repeat units derived from triethylene fluoride. Polyvinylidene fluoride and copolymers containing repeat units derived from vinylidene fluoride have been widely studied for their ferroelectric and electrocaloric properties. Examples of vinylidene fluoride-containing copolymers include copolymers with methyl methacrylate, and copolymers with one or more halogenated co-monomers including but not limited to trifluoroethylene, tetrafluoroethylene, chlorotrifluoroethylene, trichloroethylene, vinylidene chloride, vinyl chloride, and other halogenated unsaturated monomers.

Liquid crystal polymers, or polymer liquid crystals comprise polymer molecules that include mesogenic groups. Mesogenic molecular structures are well-known, and are often described as rod-like or disk-like molecular structures having electron density orientations that produce a dipole moment in response to an external field such as an external electric field. Liquid crystal polymers typically comprise numerous mesogenic groups connected by non-mesogenic molecular structures. The non-mesogenic connecting structures and their connection, placement and spacing in the polymer molecule along with mesogenic structures are important in providing the fluid deformable response to the external field. Typically, the connecting structures provide stiffness low enough so that molecular realignment is induced by application of the external field, and high enough to provide the characteristics of a polymer when the external field is not applied.

In some exemplary embodiments, a liquid crystal polymer can have rod-like mesogenic structures in the polymer backbone separated by non-mesogenic spacer groups having flexibility to allow for re-ordering of the mesogenic groups in response to an external field. Such polymers are also known as main-chain liquid crystal polymers. In some exemplary embodiments, a liquid crystal polymer can have rod-like mesogenic structures attached as side groups attached to the polymer backbone. Such polymers are also known as side-chain liquid crystal polymers.

Examples of main-chain liquid crystal polymers include those having the repeating structures shown with $C_{10}$ and $C_8$ polyethylene spacer groups, respectively:

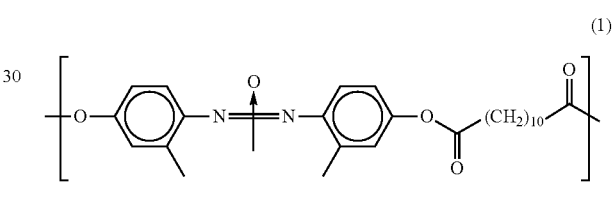

(1)

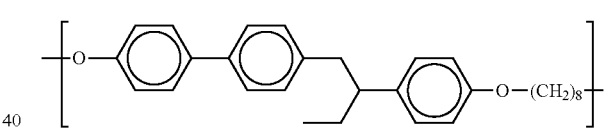

(2)

Examples of side-chain liquid crystal polymers include those having the repeating structures shown with $C_4$ and $C_{10}$ polyethylene spacer groups, respectively:

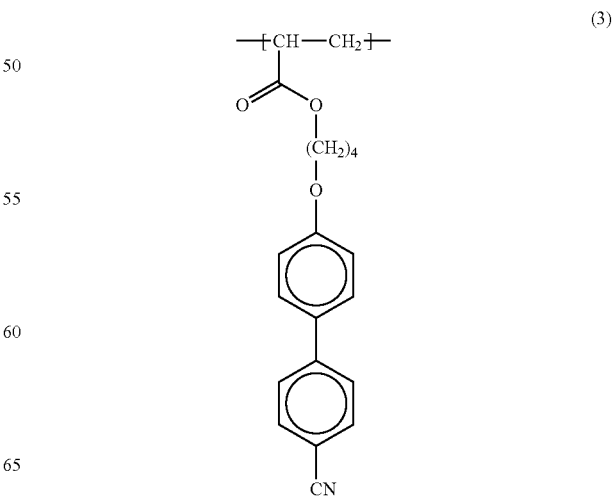

(3)

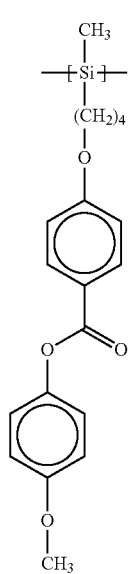

(4)

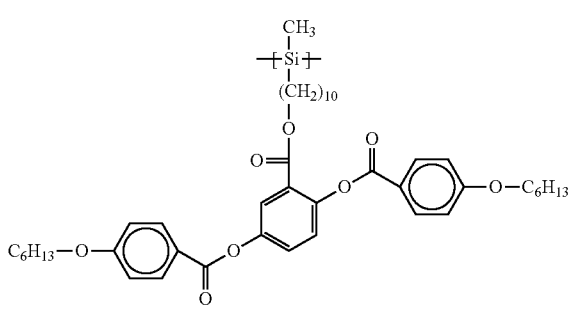

(5)

Of course, the above structures are exemplary. Many other liquid crystal polymers are known, and can be readily utilized by the skilled person In some embodiments liquid crystal elastomers can be based on liquid crystal polymers that have been modified with crosslinking. The crosslink density can be adjusted to be low enough so that local molecular flexibility is retained to allow nematic or smectic ordering of the mesogenic groups in response to an external field. However, the crosslink density can be set high enough to produce a macro elastic deformation response of the polymer to the external field instead of the Brownian molecular motion that results in a fluid, non-elastic macro response to the external field. The crosslinking reaction can rely on any type of crosslinking mechanism such as including tri- or higher-functional monomer in the monomer reactants during polymerization or by including functional side groups such as hydroxyl attached to the polymer chain, which can be reacted with a crosslinking agent such as a diisocyanate. The functional side groups can be selected to result in a mesogenic group integrated in the crosslink chain, or the mesogenic groups can be attached as side groups on the polymer chain separate from crosslink chains that are non-mesogenic. Many liquid crystal elastomers are known, and can be readily utilized by the skilled person.

With respect to the solvent, any organic solvent within the specified boiling point range can be used. In some embodiments, a polar organic solvent is used, and can in some aspects provide compatibility with the polarity of the electrocaloric polymer. In other embodiments, a non-polar organic solvent can be used. Mixtures of polar and non-polar organic solvents can also be used. Examples of solvents include but are not limited to tetrahydrofuran (THF), butanone (i.e., methylethyl ketone or MEK), chlorobenzene, supercritical $CO_2$. In some embodiments, the solvent has a boiling point of less than or equal to 100° C. In some embodiments, the solvent has a boiling point of less than or equal to 80° C. In some embodiments, the solvent has a boiling point of less than or equal to 75° C. In some embodiments, the solvent has a boiling point of less than or equal to 70° C. In some embodiments, the solvent has a boiling point of greater than 50° C. In some embodiments, the solvent has a boiling point of greater than 55° C. In some embodiments, the solvent has a boiling point of greater than 60° C. It is understood that these upper and lower range limits can be independently combined to disclose a number of different possible ranges.

The concentration of the electrocaloric polymer in the coating composition can vary widely, depending on the type of coating technique and the desired dried thickness of the coating. In some embodiments, the electrocaloric polymer content range from a lower endpoint of 0.1 wt. %, more specifically 1 wt. %, to an upper endpoint of 50 wt. %, more specifically 20 wt. %, based on the total weight of the coating composition, it being understood that the above endpoints can be independently combined to yield a number of different ranges. Additives and coating aids such as surfactants, lubricants, substrate release agents, stabilizers, antioxidants, and others can be included. Various substrates can be used, including but not limited to glass, polished stainless steel, or solvent-resistant polymers (polytetrafluoroethylene) or polymers that are dissolvable in solvents other than the solvent used for coating the electrocaloric polymer (e.g., polypropylene). Release of the electrocaloric film can be facilitated by functionalization of the substrate using low surface-energy liquids such as polyorganosiloxanes or by dissolving a polymer substrate in a solvent that doesn't dissolve the coated electrocaloric film (e.g., a non-polar organic solvent). Any of a variety of coating techniques can be used. Examples of coating techniques include, doctor blade coating, spray coating, roll coating, brush coating, spin coating, and other known coating techniques. In some aspects, doctor blade coating is used with constant speed of 1 mm/second to 1 km/second. After coating, the cast film can be dried (e.g., for 1 to 24 hours) and removed from the substrate. In some embodiments, the organic solvent is evaporated at a temperature of 0° C. to 100° C. In some embodiments, the solvent is evaporated under a pressure of less than or equal to 1 atmosphere, although pressure can in some embodiments be up to 3 atmospheres or even as high as 10 atmospheres. In some embodiments, the cast film on the substrate can be soaked in water or an organic liquid that will not adversely impact the film properties for a period of time (e.g., 1 minute to 100 hours, more specifically 6 minutes to 2 hours) to facilitate separation of the film from the substrate. After removal from the substrate, the film can be subjected to additional drying if needed to remove any liquid that was used to facilitate separation from the substrate. In some embodiments, the film can optionally be subjected to annealing. Annealing can be carried out at temperatures in a range having a lower endpoint of 30° C., more specifically 40° C., and an upper endpoint of 200° C., more specifically 100° C., it being understood that these endpoints can be independently combined to produce a number of different ranges.

In some embodiments, the methods described herein can produce electrocaloric films with various beneficial properties. In some embodiments, the film has a breakdown strength of at least 10 V/µm as determined according to ASTM D149 09 (2013). In some embodiments, the film has a breakdown strength of at least 50 V/µm. In some embodiments, the film has a breakdown strength of at least 100 V/µm. In some embodiments, the film has an electrocaloric adiabatic temperature lift of at least 0.1° C. when measured at 20 V/µm and an external temperature of 25° C. In some embodiments, the film has an electrocaloric adiabatic temperature lift of at least 5° C. when measured at 20 V/µm and an external temperature of 25° C. In some embodiments, the film has an electrocaloric adiabatic temperature lift of at least 10° C. when measured at 20 V/µm and an external temperature of 25° C. The method of claim 14, wherein the film has an electrocaloric adiabatic temperature lift of at least 10° C. when measured at 20 V/µm and an external temperature of 25° C. In some embodiments, the film has a resistivity of at least $10^{10}$ Ω·cm. In some embodiments, the film has a dielectric loss tangent of less than or equal to 0.5. In some embodiments, the film has a dielectric loss tangent of at least 0.001. Dielectric loss tangent can be measured, for example according to known standards such as IS 13203 or equivalent.

Figure 3:
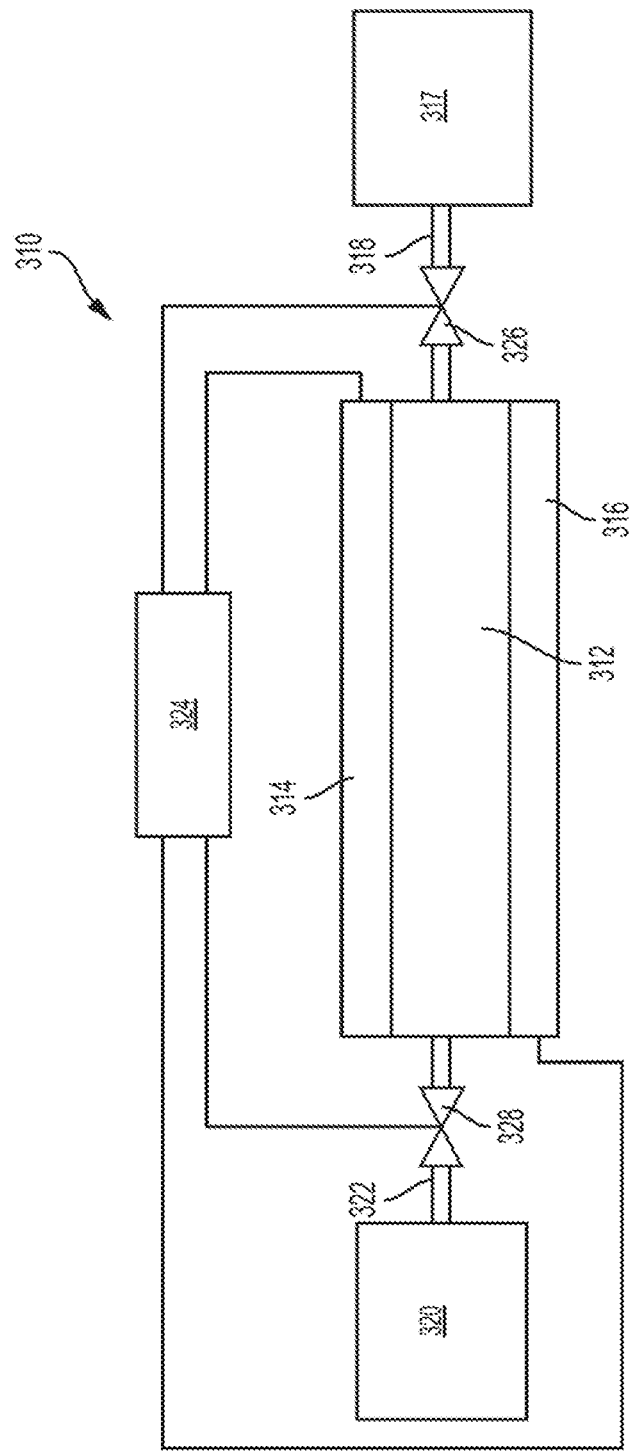
FIG. 3 is a schematic depiction of an example embodiment of heat transfer system comprising an electrocaloric element and other components.

An example embodiment of a heat transfer system and its operation are further described with respect to FIG. 3. As shown in FIG. 3, a heat transfer system 310 comprises an electrocaloric element comprising an electrocaloric polymer film 312 having electrodes 314 and 316 on opposite sides thereof. Multiple electrocaloric elements configured in a stack can also be used. The electrocaloric element is in thermal communication with a heat sink 317 through a first thermal flow path 318, and in thermal communication with a heat source 320 through a second thermal flow path 322. The thermal flow paths are described below with respect thermal transfer through flow of a heat transfer fluid through control valves 326 and 328 between the electrocaloric element and the heat sink and heat source, but can also be through conductive heat transfer through solid state heat thermoelectric switches in thermally conductive contact with the electrocaloric element and the heat source or heat sink, or thermomechanical switches in movable to establish thermally conductive contact between the electrocaloric element and the heat source or heat sink. A controller 324 is configured to control electrical current to through a power source (not shown) to selectively activate the electrodes 314, 316. The controller 324 is also configured to open and close control valves 326 and 328 to selectively direct the heat transfer fluid along the first and second flow paths 318 and 322.

In operation, the system 310 can be operated by the controller 324 applying an electric field as a voltage differential across the electrocaloric element to cause a decrease in entropy and a release of heat energy by the electrocaloric elements. The controller 324 opens the control valve 326 to transfer at least a portion of the released heat energy along flow path 318 to heat sink 317. This transfer of heat can occur after the temperature of the electrocaloric elements has risen to a threshold temperature. In some embodiments, heat transfer to the heat sink 317 is begun as soon as the temperature of the electrocaloric elements increases to be about equal to the temperature of the heat sink 317. After application of the electric field for a time to induce a desired release and transfer of heat energy from the electrocaloric elements to the heat sink 317, the electric field can be removed. Removal of the electric field causes an increase in entropy and a decrease in heat energy of the electrocaloric elements. This decrease in heat energy manifests as a reduction in temperature of the electrocaloric elements to a temperature below that of the heat source 320. The controller 324 closes control valve 326 to terminate flow along flow path 318, and opens control device 328 to transfer heat energy from the heat source 320 to the colder electrocaloric elements in order to regenerate the electrocaloric elements for another cycle.

In some embodiments, for example where a heat transfer system is utilized to maintain a temperature in a conditioned space or thermal target, the electric field can be applied to the electrocaloric elements to increase its temperature until the temperature of the electrocaloric element reaches a first threshold. After the first temperature threshold, the controller 324 opens control valve 326 to transfer heat from the electrocaloric elements to the heat sink 317 until a second temperature threshold is reached. The electric field can continue to be applied during all or a portion of the time period between the first and second temperature thresholds, and is then removed to reduce the temperature of the electrocaloric elements until a third temperature threshold is reached. The controller 324 then closes control valve 326 to terminate heat flow transfer along heat flow path 318, and opens control valve 328 to transfer heat from the heat source 320 to the electrocaloric elements. The above steps can be optionally repeated until a target temperature of the conditioned space or thermal target (which can be either the heat source or the heat sink) is reached.

Further disclosure is provided in the following Examples.

EXAMPLES

Figure 2:
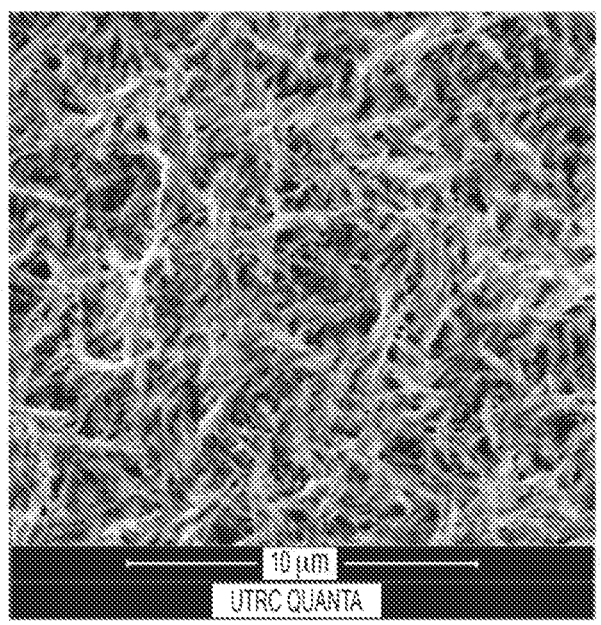
FIG. 2 is a photomicrograph of a comparison electrocaloric polymer film.

An electrocaloric polyvinylidene fluoride polymer was dissolved in tetrahydrofuran with a solids content of 0.05 g/cc and coated onto a glass substrate. The solvent was evaporated until the film was dry, and the coated substrate was immersed in water for 1 hour before removing the film from the substrate. The film was dried to remove residual water, and the unsupported film was subjected to microscopic imaging, the results of which are shown in FIG. 1. A comparison film was prepared using like amounts and processing, but with dimethylformamide (DMF, BP approximately 153° C.) as the solvent, and the microscopic imaging results are shown in FIG. 2. As can be readily seen from a comparison of FIGS. 1 and 2, the film prepared with the low boiling point solvent exhibited substantially lower porosity and greater surface density compared to the film prepared with the high boiling point solvent.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

The invention claimed is:

1. A method of making a heat transfer system, comprising dissolving or dispersing an electrocaloric polymer in an organic solvent to form a liquid composition comprising the electrocaloric polymer in an amount of 0.1 to 50 weight percent, based on the total weight of the liquid composition; wherein the electrocaloric polymer is liquid crystal polymer having a structure (1)
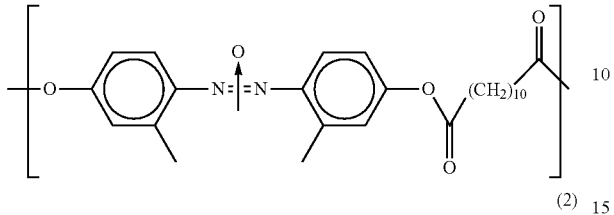

(2)
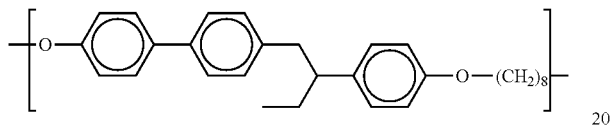

(3)
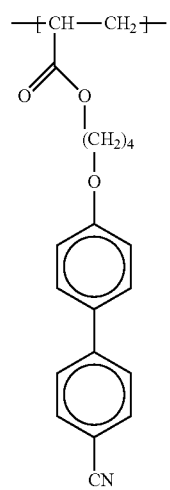

(4)
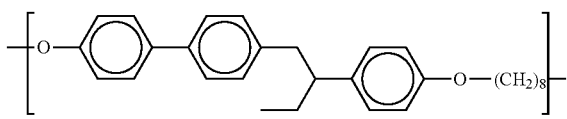, or (5)
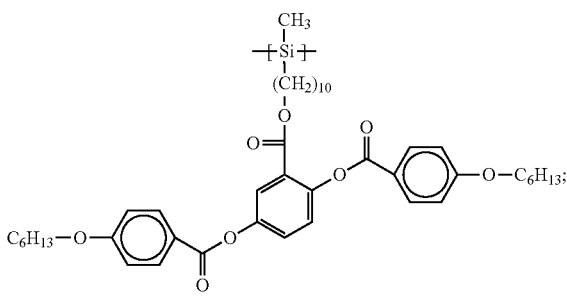

casting a film of the liquid composition on a substrate;

evaporating the organic solvent to form a film comprising the electrocaloric polymer;

wherein the organic solvent is selected from the group consisting of tetrahydrofuran, chlorobenzene, supercritical $CO_2$, or a combination thereof;

removing the film from the substrate; and disposing the film between electrical conductors to form an electrocaloric element; and providing a fluid flow path between the electrocaloric element and a heat source or a heat sink for controlled heat transfer between the electrocaloric element and the heat source or heat sink.

2. A method of making an electrocaloric element, comprising dissolving or dispersing an electrocaloric polymer in an organic solvent to form a liquid composition comprising the electrocaloric polymer in an amount of 0.1 to 50 weight percent, based on the total weight of the liquid composition; wherein the electrocaloric polymer is a liquid crystal polymer having a structure (1)
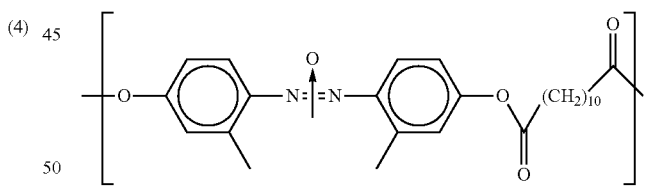

(2)
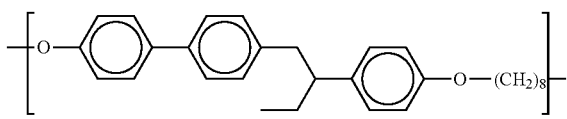

-continued

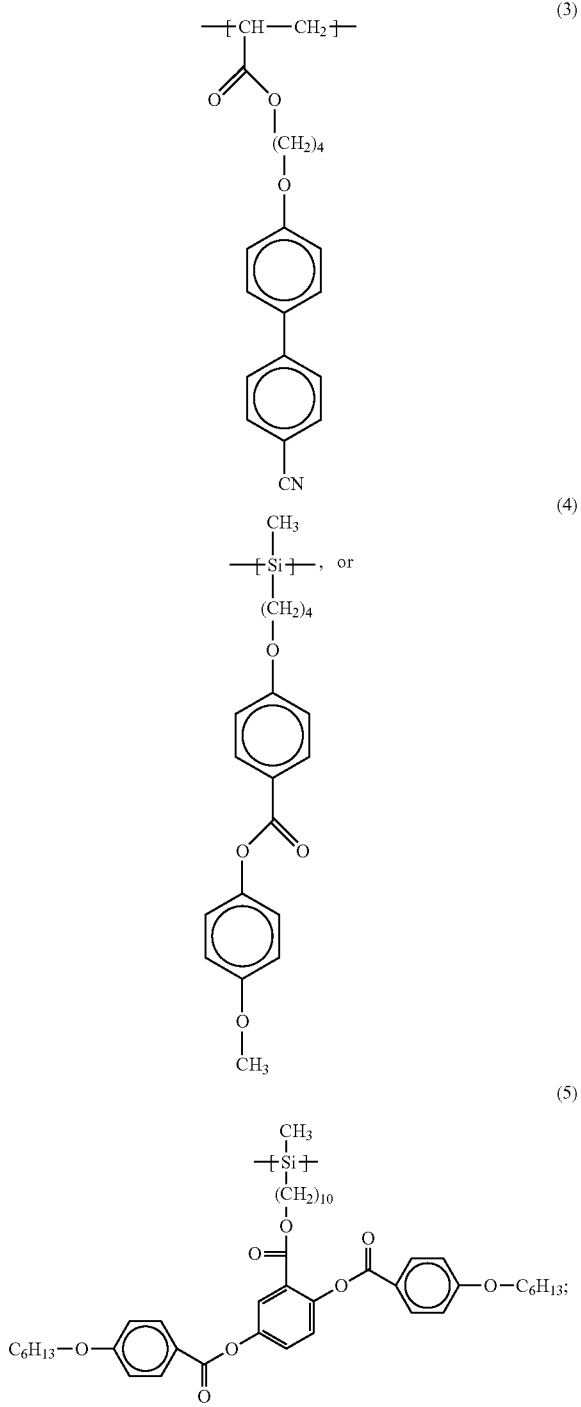

casting a film of the liquid composition on a substrate;
evaporating the organic solvent to form a film comprising the electrocaloric polymer;
wherein the organic solvent is selected from the group consisting of tetrahydrofuran, chlorobenzene, supercritical $CO_2$, or a combination thereof;
removing the film from the substrate; and
disposing the film between electrical conductors.

3. The method of claim 2, wherein the solvent has a boiling point of less than 70° C. at 1 atmosphere.

4. The method of claim 2, wherein the organic solvent is evaporated at a temperature of 0° C. to 100° C. at <=10 atm.

5. The method of claim 2, wherein the film is annealed for 1 minute to 1000 hours following evaporation of the organic solvent.

6. The method of claim 2, wherein the film is annealed at a temperature of 0° C. to 200° C. following evaporation of the organic solvent.

7. The method of claim 2, wherein the film has a breakdown strength of at least 10 V/μm.

8. The method of claim 7, wherein the film has a breakdown strength of at least 50 V/μm.

9. The method of claim 7, wherein the film has a breakdown strength of at least 100 V/μm.

10. The method of claim 2, wherein the film has an electrocaloric adiabatic temperature lift of at least 0.1° C. when measured at 20 V/um and an external temperature of 25° C.

11. The method of claim 10, wherein the film has an electrocaloric adiabatic temperature lift of at least 5° C. when measured at 20 V/um and an external temperature of 25° C.

12. The method of claim 10, wherein the film has a electrocaloric adiabatic temperature lift of at least 10° C. when measured at 20 V/um and an external temperature of 25° C.

13. The method of claim 2, wherein the film has a resistivity of at least $10^{10}$ Ω·cm.

14. The method of claim 2, wherein the film has a dielectric loss tangent of less than or equal to 0.5.

15. The method of claim 14, wherein the film has a dielectric loss tangent of at least 0.001.

* * * * *